United States Patent
Narahara et al.

(10) Patent No.: US 11,846,039 B2
(45) Date of Patent: Dec. 19, 2023

(54) VAPOR DEPOSITION DEVICE AND METHOD FOR MANUFACTURING EPITAXIAL SILICON WAFER

(71) Applicant: SUMCO CORPORATION, Tokyo (JP)

(72) Inventors: Kazuhiro Narahara, Tokyo (JP); Masayuki Tsuji, Tokyo (JP); Haku Komori, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 175 days.

(21) Appl. No.: 17/417,496

(22) PCT Filed: Sep. 11, 2019

(86) PCT No.: PCT/JP2019/035621
§ 371 (c)(1),
(2) Date: Jun. 23, 2021

(87) PCT Pub. No.: WO2020/137021
PCT Pub. Date: Jul. 2, 2020

(65) Prior Publication Data
US 2022/0106704 A1    Apr. 7, 2022

(30) Foreign Application Priority Data

Dec. 25, 2018   (JP) .................................. 2018-241366

(51) Int. Cl.
*C30B 25/12*    (2006.01)
*C30B 29/06*    (2006.01)
(Continued)

(52) U.S. Cl.
CPC .............. *C30B 29/06* (2013.01); *C23C 16/24* (2013.01); *C23C 16/4581* (2013.01);
(Continued)

(58) Field of Classification Search
CPC . C23C 16/24; C23C 16/4581; C23C 16/4584; C23C 16/4585; C23C 16/4586; C30B 25/12; C30B 25/20; C30B 29/06
See application file for complete search history.

(56) References Cited

U.S. PATENT DOCUMENTS

| | | |
|---|---|---|
| 2002/0043337 A1 | 4/2002 | Goodman et al. |
| 2015/0162230 A1 | 6/2015 | Bautista et al. |
| 2018/0135166 A1* | 5/2018 | Sakurai .................. C23C 16/24 |

FOREIGN PATENT DOCUMENTS

| | | |
|---|---|---|
| JP | 2001-127143 | 5/2001 |
| JP | 2001-522142 | 11/2001 |

(Continued)

OTHER PUBLICATIONS

Official Communication issued in International Bureau of WIPO Patent Application No. PCT/JP2019/035621, dated Nov. 19, 2019, along with an English translation thereof.

(Continued)

*Primary Examiner* — Hua Qi
(74) *Attorney, Agent, or Firm* — Greenblum & Bernstein, P.L.C.

(57) ABSTRACT

A vapor deposition apparatus includes a disc-shaped susceptor and a susceptor support member that supports and rotates the susceptor. The susceptor has a plurality of fitting grooves. The susceptor support member is provided with a plurality of support pins to be fitted in the respective plurality of fitting grooves. The fitting grooves each have an inclined portion that relatively moves the support pin with respect to the fitting groove in a circumferential direction of the susceptor with the support pin kept in contact by virtue of a self-weight of the susceptor and a positioning portion that positions the support pin relatively moved by the inclined portion at a specific position in the circumferential (Continued)

direction. The inclined portion and the positioning portion are formed continuously in a radial direction of the susceptor.

7 Claims, 8 Drawing Sheets

(51) Int. Cl.
*C23C 16/24* (2006.01)
*C23C 16/458* (2006.01)
*C30B 25/20* (2006.01)

(52) U.S. Cl.
CPC ...... *C23C 16/4584* (2013.01); *C23C 16/4585* (2013.01); *C30B 25/12* (2013.01); *C30B 25/20* (2013.01); *Y10T 117/00* (2015.01)

(56) References Cited

FOREIGN PATENT DOCUMENTS

| JP | 2007088303 A * | 4/2007 |
|----|----------------|--------|
| JP | 4575262 | 11/2010 |
| JP | 2014-138056 | 7/2014 |
| JP | 2017-501570 | 1/2017 |

OTHER PUBLICATIONS

International Preliminary Report on Patentability issued in International Patent Application No. PCT/JP2019/035621, dated Nov. 19, 2019, along with an English translation thereof.

* cited by examiner

VAPOR DEPOSITION DEVICE AND METHOD FOR MANUFACTURING EPITAXIAL SILICON WAFER

TECHNICAL FIELD

The present invention relates to a vapor deposition apparatus and a method of manufacturing an epitaxial silicon wafer.

BACKGROUND ART

In a vapor deposition apparatus, a disc-shaped susceptor, on which a silicon wafer is to be mounted, is supported from below by a susceptor support member and rotatable with the susceptor support member. Regarding such a configuration, a reduction in a positional deviation between a rotation center of the susceptor support member and a center of the susceptor has been discussed (for instance, see Patent Literature 1).

In a vapor deposition apparatus in Patent Literature 1, a lower surface of a susceptor is provided with a ring-shaped annular groove. The annular groove is formed such that a shape of a vertical cross section thereof along a radial direction of the susceptor is an arc. A susceptor support member is provided with three heads, which are to be fitted in the annular groove, arranged along a circumferential direction of the susceptor at regular intervals. A distal end of each of the heads is formed in a spherical shape with a radius smaller than a radius of the arc of the annular groove.

By virtue of such a configuration of the annular groove and the heads, a self-weight of the susceptor causes contact portions between the heads and the annular groove to move to a bottom of the annular groove, thereby reducing a positional deviation between a rotation center of the susceptor support member and a center of the susceptor.

CITATION LIST

Patent Literature(s)

Patent Literature 1: JP 4575262 B

SUMMARY OF THE INVENTION

Problem(s) to be Solved by the Invention

However, in the configuration as in Patent Literature 1, expansion and contraction of the susceptor during a process for raising or lowering temperature applied to the susceptor would cause the bottom of the annular groove to be shifted outward or inward in the radial direction of the susceptor with respect to the heads, causing the heads of the susceptor support member to come out of the annular groove. In such a case, the susceptor is deviated from a desired position and, consequently, a vapor deposition process is performed with the center of the susceptor and a rotation axis of the susceptor support member in misalignment with each other, which would result in a failure in achieving uniformity in epitaxial film thickness.

An object of the invention is to provide a vapor deposition apparatus and a method of manufacturing an epitaxial silicon wafer that are capable of reducing a positional deviation of a susceptor relative to a susceptor support member during a vapor deposition process.

Means for Solving the Problem(s)

A vapor deposition apparatus according to an aspect of the invention is configured to form an epitaxial film on a silicon wafer and includes: a disc-shaped susceptor on which the silicon wafer is to be mounted; and a susceptor support member configured to support the susceptor and cause the susceptor to rotate, in which one of the susceptor and the susceptor support member is provided with a plurality of fitting grooves and the other of the susceptor and the susceptor support member is provided with a plurality of fitting projections configured to be fitted in the respective plurality of fitting groove, the fitting grooves each have an inclined portion and a positioning portion, the inclined portion being inclined with respect to a mount surface of the susceptor for the silicon wafer and being configured to relatively move corresponding one of the fitting projections with respect to the fitting groove in a circumferential direction of the susceptor with the fitting projection kept in contact by virtue of a self-weight of the susceptor, the positioning portion being configured to position the fitting projection relatively moved by the inclined portion at a specific position in the circumferential direction, and the inclined portion and the positioning portion are formed continuously in a radial direction of the susceptor.

In the aspect of the invention, each of the fitting projections relatively moves along the inclined portion of the fitting groove by virtue of the self-weight of the susceptor, being positioned at a specific position in the circumferential direction of the susceptor by the positioning portion. Further, with the inclined portion and the positioning portion continuously formed in the radial direction of the susceptor, each of the fitting projections is positioned at the specific position in the circumferential direction of the susceptor before and after thermal expansion of the susceptor. This makes it possible to reduce a positional offset of the susceptor relative to the susceptor support member during a vapor deposition process.

In the vapor deposition apparatus of the above aspect, it is preferable that a contact portion of each of the fitting projections with the inclined portion be formed in a shape of a concave curve.

In the aspect of the invention, each of the fitting projections can be less likely to wear due to a relative movement relative to the inclined portion, which allows for reducing a positional deviation of the susceptor from the susceptor support member over time.

In the vapor deposition apparatus of the above aspect, it is preferable that a surface roughness Ra of each of the inclined portion and the positioning portion be 2 μm or less.

In the aspect of the invention, each of the fitting projections can be less likely to wear due to a relative movement relative to the inclined portion and the positioning portion, which allows for reducing a positional deviation of the susceptor from the susceptor support member over time.

A method of manufacturing an epitaxial silicon wafer according to another aspect of the invention includes forming an epitaxial film on a silicon wafer, in which the epitaxial film on the silicon wafer is formed by using the vapor deposition apparatus.

According to the aspects of the invention, the susceptor is prevented from being deviated from a desired position, which makes it possible to prevent deviation of a mount position of a silicon wafer on the susceptor, so that an epitaxial film thickness can be uniformed.

BRIEF DESCRIPTION OF DRAWING(S)

FIG. 1 schematically shows a vapor deposition apparatus according to an exemplary embodiment of the invention.

Figure 5A:
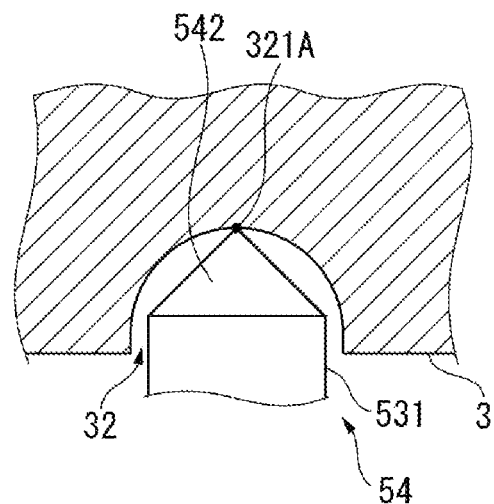

FIG. 5A schematically shows a fitted state of the susceptor and the support pin according to a modification of the invention.

Figure 5B:
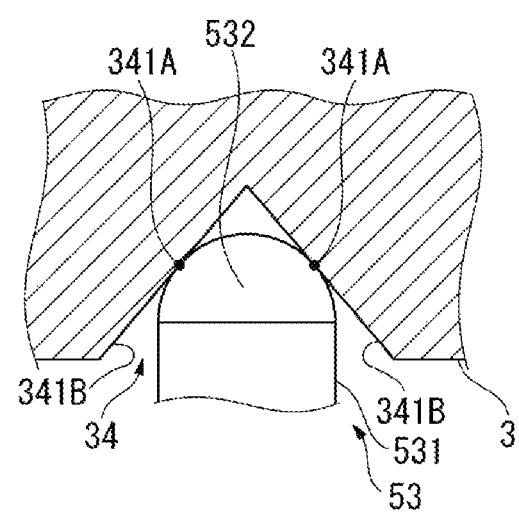

FIG. 5B schematically shows a fitted state of the susceptor and the support pin according to another modification of the invention.

Figure 5C:
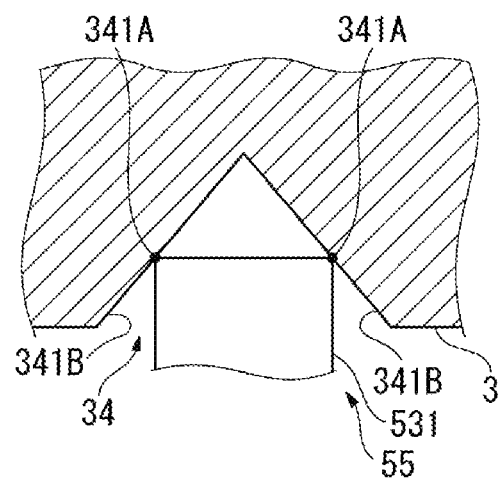

FIG. 5C schematically shows a fitted state of the susceptor and the support pin according to still another modification of the invention.

Figure 6:
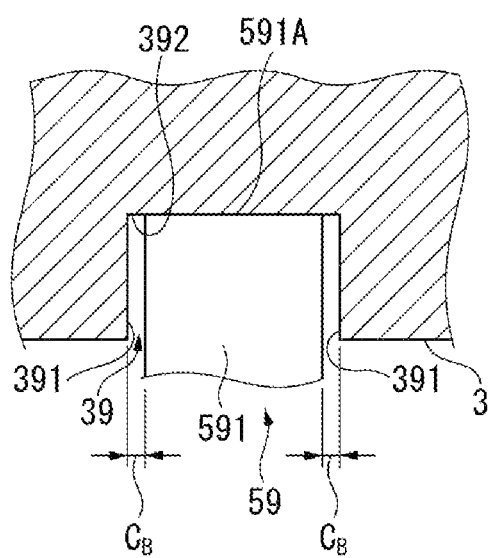

FIG. 6 schematically shows a fitted state of the susceptor and the support pin of Comparative Example in Example of the invention.

Figure 7A:
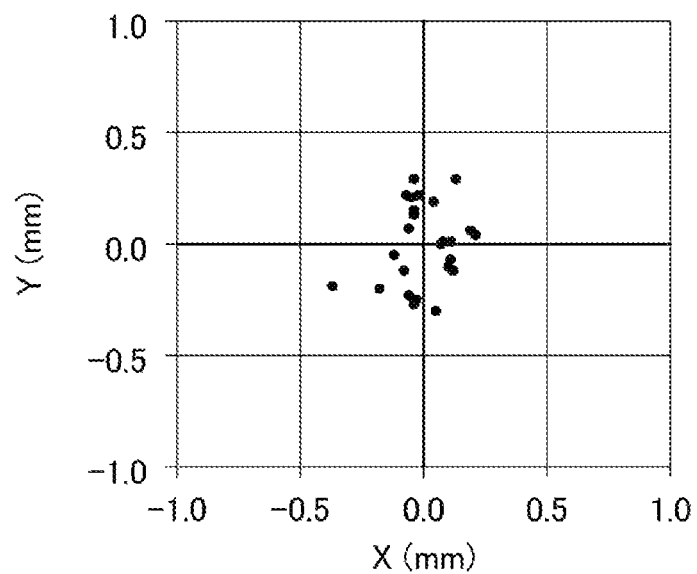

FIG. 7A shows distribution of mount positions relative to a target mount position on the susceptor during process of initial 25 silicon wafers in above-mentioned Example, illustrating distribution in Comparative Example.

Figure 7B:
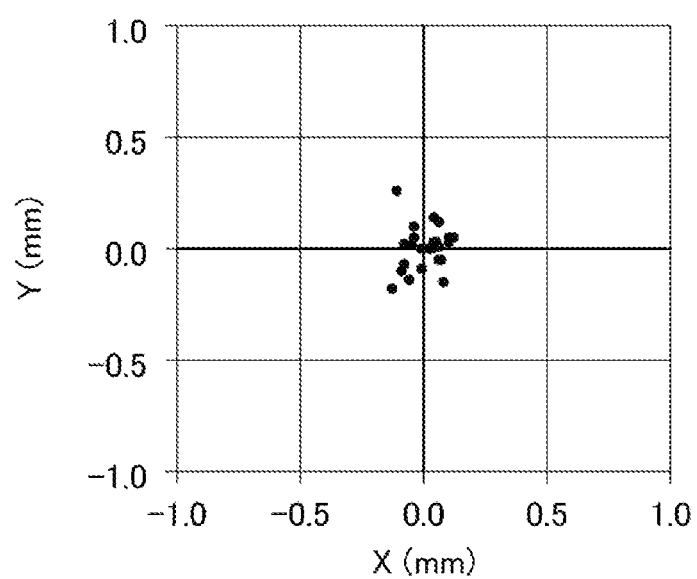

FIG. 7B shows distribution of mount positions relative to the target mount position on the susceptor during process of initial 25 silicon wafers in above-mentioned Example, illustrating distribution in Example.

Figure 8A:
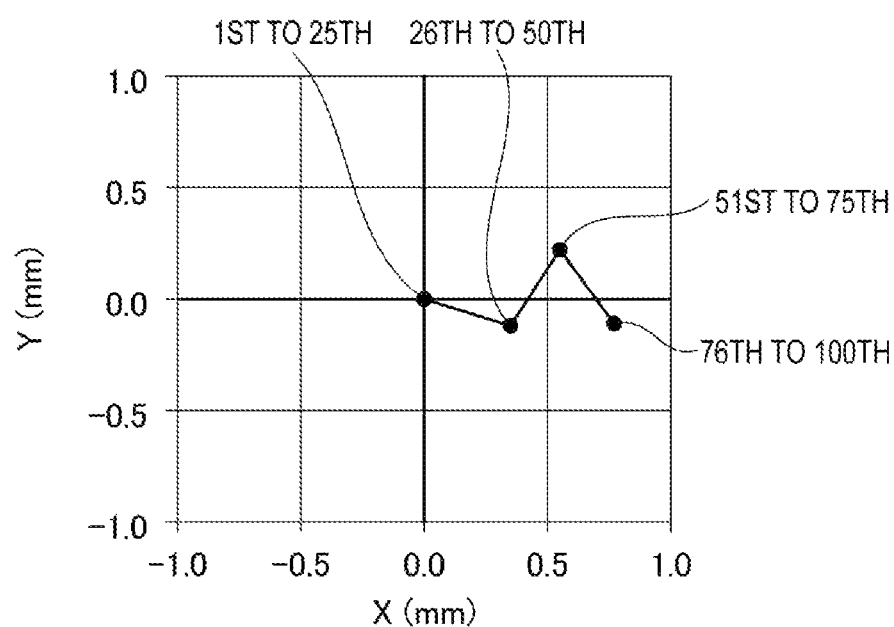

FIG. 8A shows transition of an average mount position relative to the target mount position on the susceptor on the basis of every 25 silicon wafers being processed in above-mentioned Example, illustrating transition in Comparative Example.

Figure 8B:
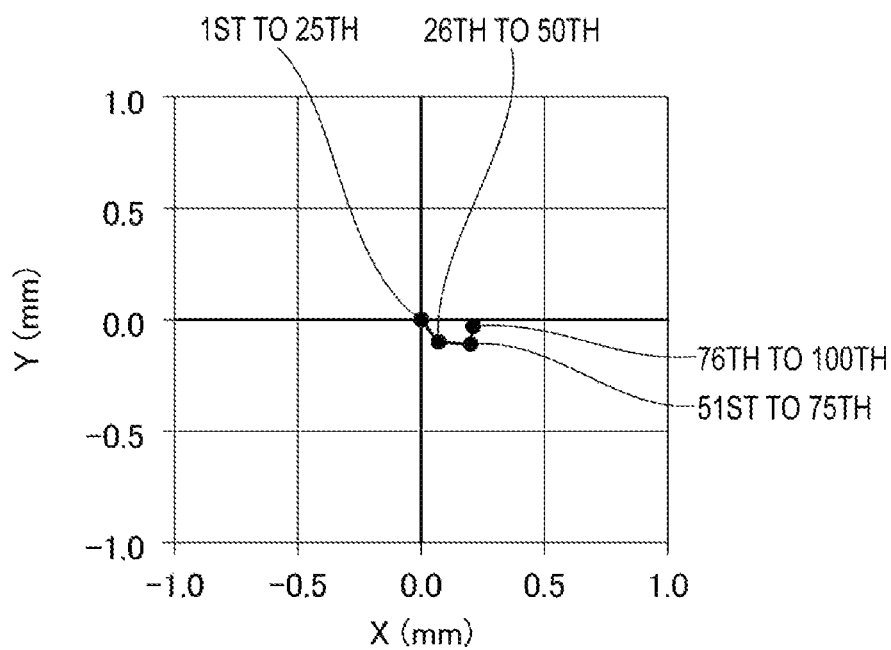

FIG. 8B shows transition of an average mount position relative to the target mount position on the susceptor on the basis of every 25 silicon wafers being processed in above-mentioned Example, illustrating transition in Example.

DESCRIPTION OF EMBODIMENT(S)

Exemplary Embodiment(s)

Description will be made below on an exemplary embodiment of the invention.

Configuration of Vapor Deposition Apparatus

Figure 1:
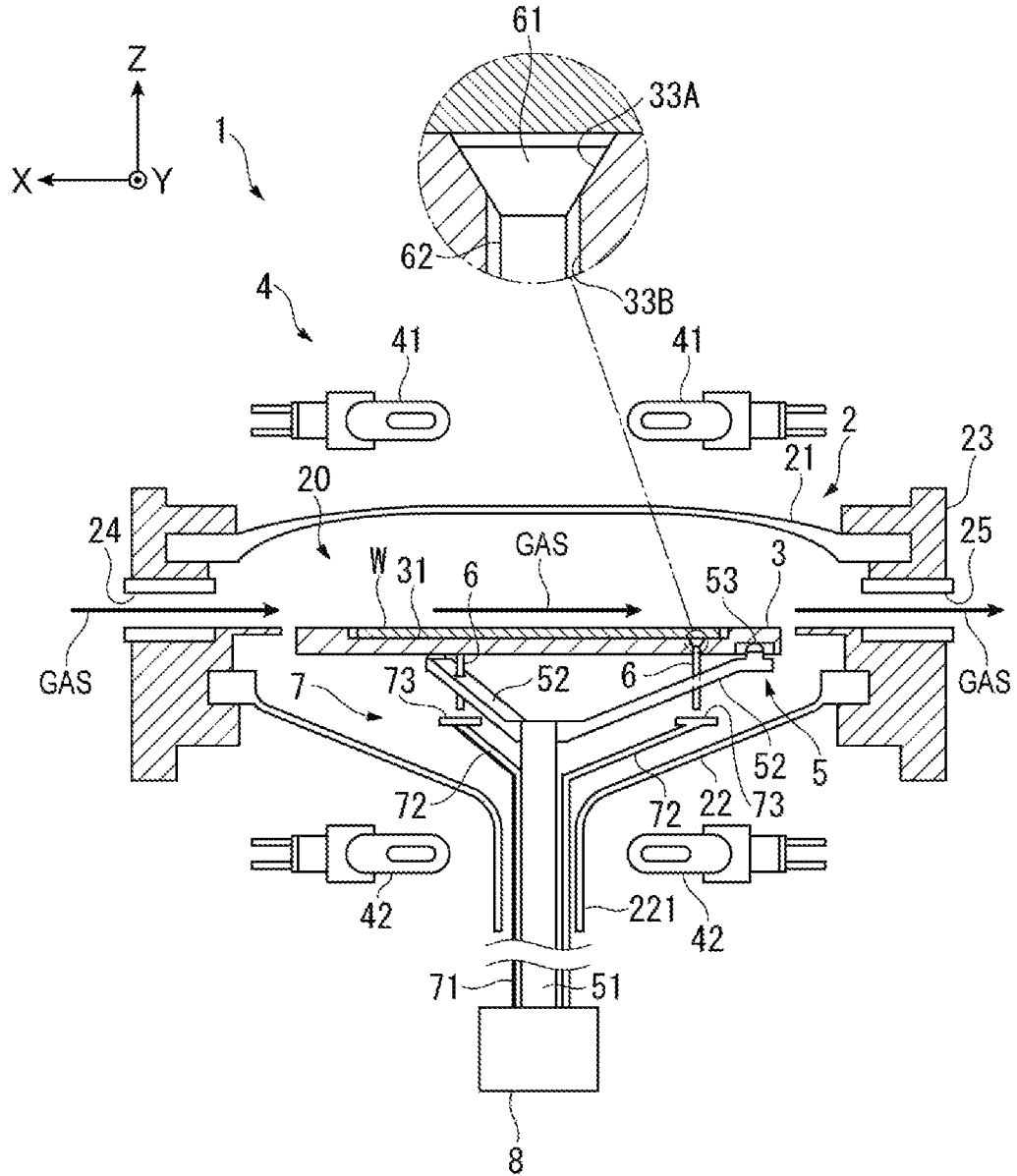

As shown in FIG. 1, a vapor deposition apparatus 1 includes a chamber 2, a susceptor 3, a heater 4, a susceptor support member 5, three lift pins 6, a lift pin support member 7, and a drive unit 8.

The chamber 2 includes an upper dome 21, a lower dome 22, and a dome fixture 23 fixing respective peripheries of the domes 21 and 22 to each other. The upper dome 21, the lower dome 22, and the dome fixture 23 define an epitaxial film formation chamber 20.

The upper dome 21 and the lower dome 22 are formed of quartz.

The lower dome 22 is provided, at a middle thereof, with a cylindrical portion 221 extending downward and that is configured to receive a main column 71 of the later-described lift pin support member 7 therein.

The dome fixture 23 has a gas inlet 24 for delivering a reactive gas into the epitaxial film formation chamber 20 and a gas outlet 25 for discharging the reactive gas out of the epitaxial film formation chamber 20.

Figure 2:
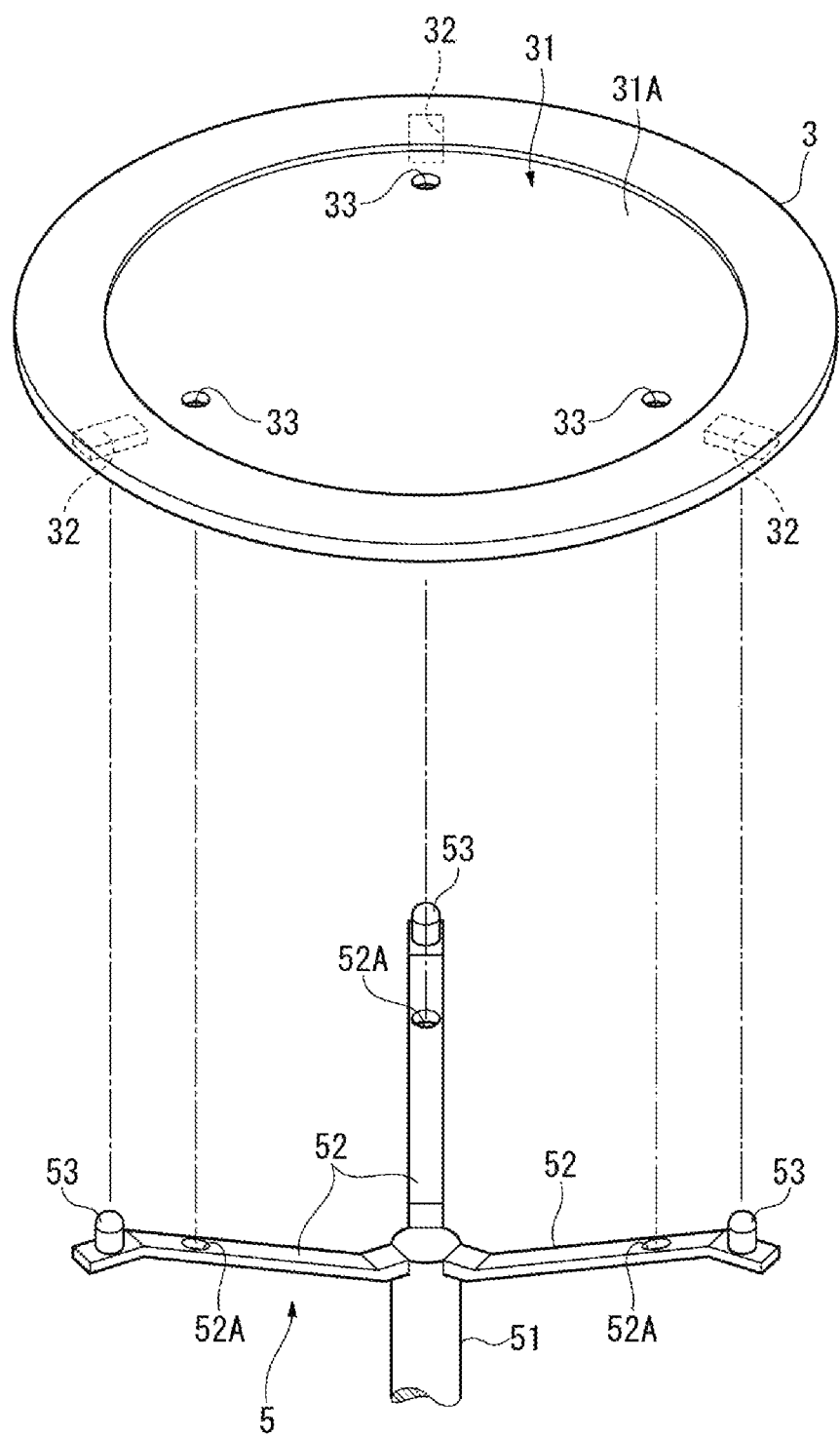
FIG. 2 is a perspective view of a susceptor and a susceptor support member of the vapor deposition apparatus.

As shown in FIG. 2, the susceptor 3 is formed of carbon coated with silicon carbide into a shape of a disc.

One of principal surfaces of the susceptor 3 is provided with a circular countersink 31 configured to receive a silicon wafer W. A diameter of the countersink 31 is larger than a diameter of the silicon wafer W.

The other principal surface of the susceptor 3 is provided, near a periphery thereof, with three fitting grooves 32 where later-described support pins 53 are to be fitted. The fitting grooves 32 are provided in a circumferential direction of the susceptor 3 at intervals of 120 degrees. It should be noted that a further detailed configuration of the fitting grooves 32 will be described later.

The susceptor 3 is also provided with three through holes 33 penetrating both the principal surfaces.

The through holes 33 are provided inside the countersink 31 in the circumferential direction of the susceptor 3 at intervals of 120 degrees. As shown in a partial enlarged view in FIG. 1, the through holes 33 each have a cone-shaped tapered portion 33A with an inner diameter reduced from a mount surface 31A of the countersink 31, on which the silicon wafer W is to be mounted, toward a center of the susceptor 3 in a thickness direction and a shaft hole portion 33B with an inner diameter constant in the thickness direction of the susceptor 3.

The heater 4 includes an upper heater 41 and a lower heater 42 provided above and below the chamber 2, respectively. The upper heater 41 and the lower heater 42 each include an infrared lamp or a halogen lamp.

The susceptor support member 5 is formed of quartz. As shown in FIG. 2, the susceptor support member 5 includes a columnar main column 51, three arms 52 radially extending from a distal end of the main column 51, and support pins 53, which serve as fitting projections, provided at distal ends of the respective arms 52.

The arms 52 are provided in a circumferential direction of the main column 51 at intervals of 120 degrees, extending obliquely upward. A through hole 52A penetrating the arm 52 is provided near the support pin 53 with respect to a middle of each of the arms 52.

The support pins 53, which are formed of pure SiC, are fitted into the respective fitting grooves 32 of the susceptor 3 to support the susceptor 3. It should be noted that a further detailed configuration of the support pins 53 will be described later.

The lift pins 6 are each formed of, for instance, carbon coated with silicon carbide into a shape of a rod. The lift pins 6 each include a head 61 in a shape of a truncated cone and a shaft 62 extending in a columnar shape from a smaller-diameter end of the head 61 as shown in the partial enlarged view in FIG. 1.

The lift pins 6 are each supported by the susceptor 3 with the shaft 62 inserted in the shaft hole portion 33B of the through hole 33 and the head 61 being in contact with the tapered portion 33A by virtue of a self-weight thereof.

The lift pin support member 7 is formed of quartz. The lift pin support member 7 includes the cylindrical main column 71, three arms 72 radially extending from a distal end of the main column 71, and contact portions 73 provided at distal ends of the respective arms 72.

The arms 72 are provided in a circumferential direction of the main column 71 at intervals of 120 degrees, extending obliquely upward.

The contact portions 73 are configured to support the respective lift pins 6 from below.

The main column 71 is inserted in the cylindrical portion 221 of the lower dome 22. The main column 51 is inserted inside the main column 71 with the arms 72 located below the respective arms 52 of the susceptor support member 5 and lower ends of the lift pins 6, which are supported by the susceptor 3, being able to come into contact with the respective contact portions 73.

The drive unit 8 is configured to rotate the susceptor support member 5 and the lift pin support member 7 and move the lift pin support member 7 upward and downward.

Detailed Configurations of Fitting Grooves and Support Pins

Figure 3A:
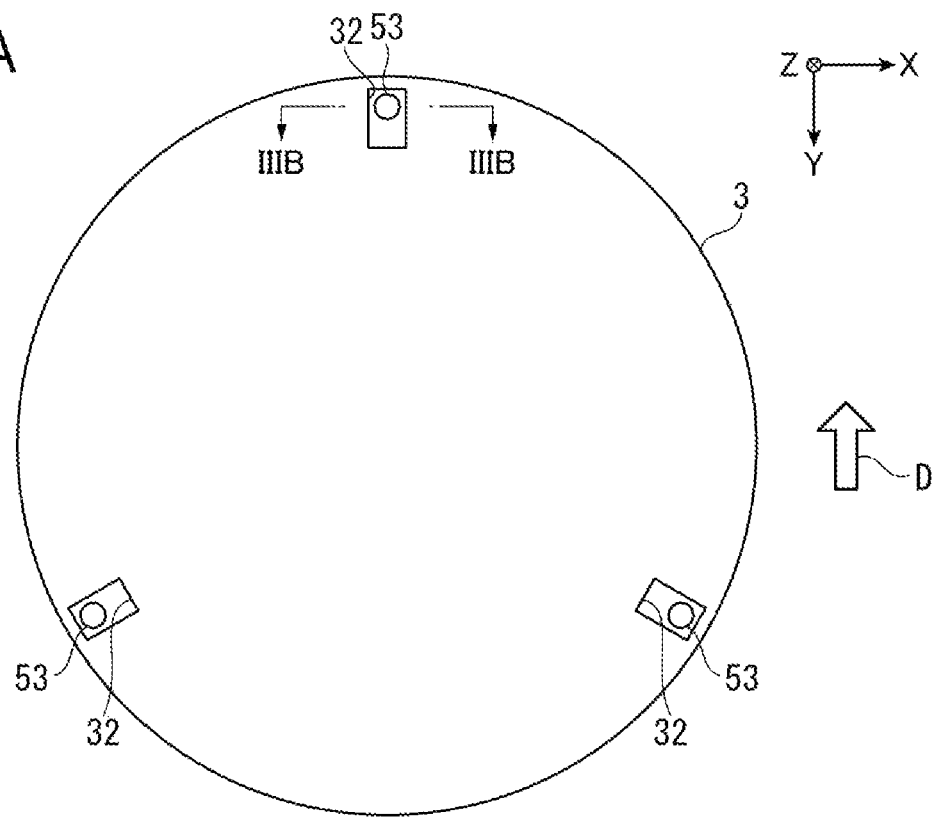
FIG. 3A shows a state where a support pin is fitted in a fitting groove of the susceptor as seen from below.
Figure 3B:
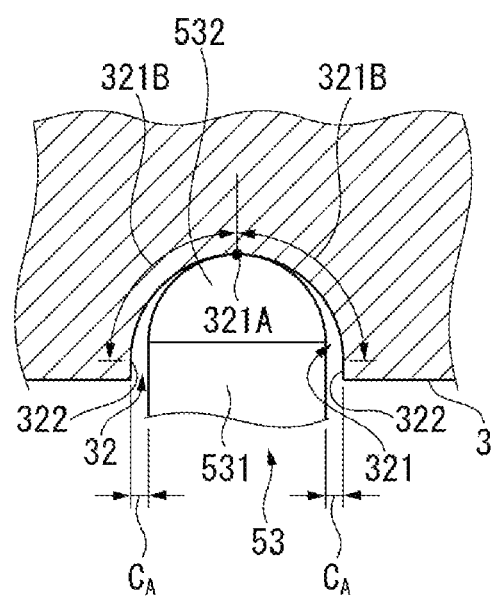
FIG. 3B is a cross sectional view taken along a IIIB-IIIB line in FIG. 3A.

The fitting grooves 32 are each formed in a rectangular shape extending in a radial direction of the susceptor 3 in a bottom view as shown in FIG. 3A. One of the three fitting grooves 32 is located on an imaginary line passing through a center of the susceptor 3 and that is parallel with a loading direction D for the silicon wafer W, while being on a side in the loading direction D with respect to the center of the susceptor 3. Further, the fitting grooves 32 each have an arc surface portion 321 in a semicircular shape in a vertical cross sectional view perpendicular to a direction in which the fitting groove 32 extends and flattened surface portions 322 extending downward from both respective ends of the arc surface portion 321 as shown in FIG. 3B. The arc surface portion 321 and the flattened surface portions 322 are continuously formed in the same shape along the radial direction of the susceptor 3. A surface roughness Ra of the arc surface portion 321 and the flattened surface portions 322 are 2 μm or less.

Within a portion providing the arc surface portion 321, a portion present at a highest position in a height direction provides a positioning portion 321A. Within the portion providing the arc surface portion 321, a portion other than the positioning portion 321A provides an inclined portion 321B. The inclined portion 321B is inclined with respect to the mount surface 31A of the susceptor 3 for the silicon wafer W.

Each of the support pins 53 includes a base 531 extending upward in a columnar shape from the corresponding one of the arms 52 and a semispherical slide contact head 532 provided at a distal end of the base 531.

A variation in precision of members such as the fitting grooves 32 and the support pins 53 would result in a failure in fitting the support pins 53 in the respective fitting grooves 32. To prevent such a failure, diameters of the bases 531 and the slide contact heads 532 are smaller than a diameter of the arc surface portion 321 of each of the fitting grooves 32 and a distance between the pair of flattened surface portions 322.

Manufacturing Method of Epitaxial Silicon Wafer

Next, description will be made on a method of manufacturing an epitaxial silicon wafer by using the vapor deposition apparatus 1.

First, the silicon wafer W is prepared. The silicon wafer W may have any diameter such as 200 mm, 300 mm, or 450 mm.

Figure 4A:
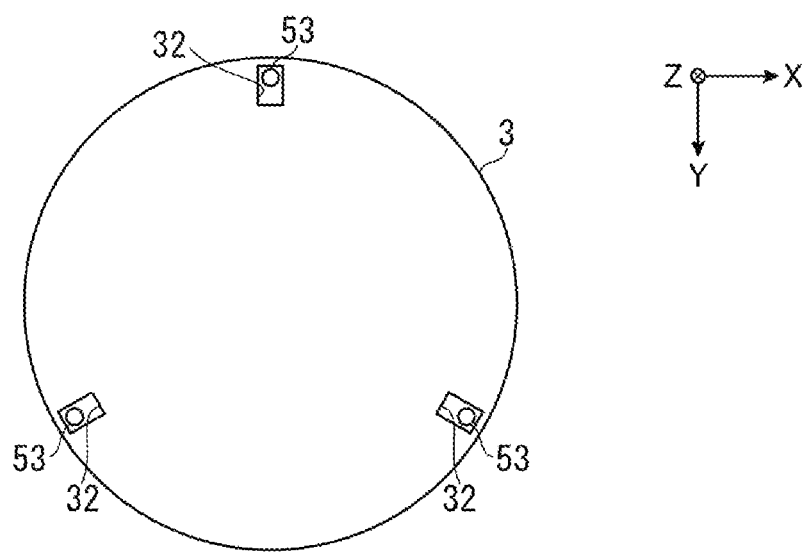
FIG. 4A shows a state at room temperature where the support pin is fitted in the fitting groove of the susceptor as seen from below.

When the epitaxial film formation chamber 20 of the vapor deposition apparatus 1 is at room temperature without being heated by the heater 4, the support pins 53 are located on an outer side in the radial direction of the susceptor 3 within the respective fitting grooves 32 as shown in FIG. 4A. Further, with the susceptor 3 mounted on the support pins 53, the slide contact heads 532 sometimes first come into contact with the inclined portions 321B of the fitting grooves 32. However, a self-weight of the susceptor 3 causes contact portions between the slide contact heads 532 and the respective fitting grooves 32 to move toward the positioning portions 321A. Then, with tops of the slide contact heads 532 coming into contact with the respective positioning portions 321A, the support pins 53 are positioned at specific positions in the circumferential direction of the susceptor 3 within the respective fitting grooves 32. With the support pins 53 positioned in this manner, the center of the susceptor 3 is aligned with a rotation axis of the susceptor support member 5 and the susceptor 3 is supported by the susceptor support member 5 such that a principal surface of the silicon wafer W mounted on the susceptor 3 is parallel with a horizontal plane.

Figure 4B:
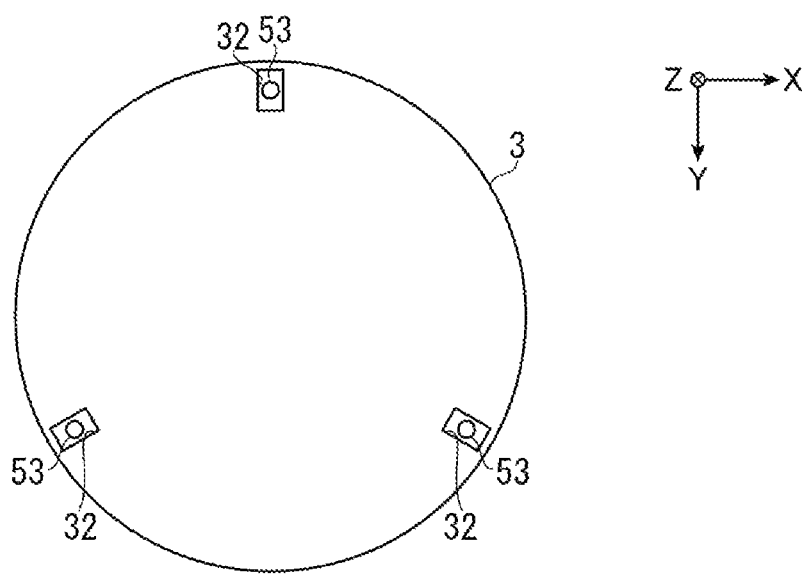
FIG. 4B shows a state where the support pin is fitted in the fitting groove of the susceptor as seen from below and where a set temperature for loading is reached by heating.

Next, as preparation before loading the silicon wafer W into the epitaxial film formation chamber 20, the heater 4 of the vapor deposition apparatus 1 heats the epitaxial film formation chamber 20 to a set temperature for loading. The set temperature for loading is usually in a range from 650 degrees to 800 degrees C. During this heating, the susceptor 3 expands more than the susceptor support member 5 due to a coefficient of thermal expansion of a constituent material of the susceptor 3 being larger than a coefficient of thermal expansion of a constituent material of the susceptor support member 5, thus causing the support pins 53 to relatively move within the respective fitting grooves 32 toward an inner side in the radial direction of the susceptor 3 as shown in FIG. 4B. However, the support pins 53 are positioned at the specific positions in the circumferential direction of the susceptor 3 within the respective fitting grooves 32 by virtue of the above-described effect attributed to the self-weight of the susceptor 3, so that the center of the susceptor 3 and the rotation axis of the susceptor support member 5 are kept in alignment with each other.

Subsequently, a support member of a loading unit not shown loads the silicon wafer W into the epitaxial film formation chamber 20 through a wafer loading/unloading opening (not shown) of the chamber 2 and stops the silicon wafer W above the countersink 31 of the susceptor 3. The drive unit 8 then moves the lift pins 6 supported by the susceptor 3 upward by moving the lift pin support member 7 upward, thereby lifting the silicon wafer W off the support member. After the loading unit moves the support member out of the chamber 2, the drive unit 8 moves the lift pin support member 7 downward, thereby mounting the silicon wafer W into the countersink 31 of the susceptor 3.

Figure 4C:
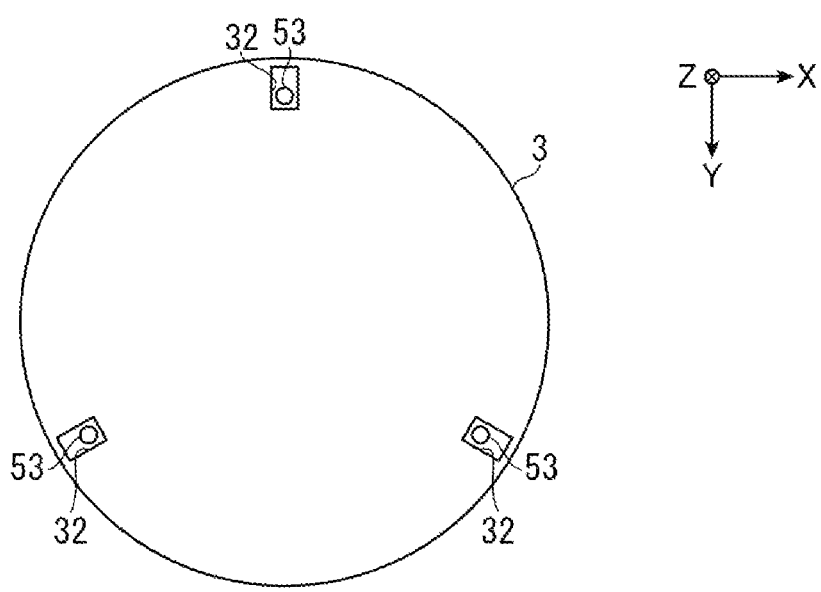
FIG. 4C shows a state where the support pin is fitted in the fitting groove of the susceptor as seen from below and where a set temperature for film formation is reached by heating.

Next, as preparation before an epitaxial film formation process, the heater 4 further heats the epitaxial film formation chamber 20 to a set temperature for film formation. The set temperature for film formation is usually in a range from 1050 degree C. to 1150 degrees C. Likewise, during this heating, the susceptor 3 expands more than the susceptor support member 5, thus causing the support pins 53 to relatively move within the respective fitting grooves 32 further toward the inner side in the radial direction of the susceptor 3 as shown in FIG. 4C. Even in this case, the center of the susceptor 3 and the rotation axis of the susceptor support member 5 are kept in alignment with each other by virtue of the above-described effect attributed to the self-weight of the susceptor 3.

A carrier gas, or hydrogen gas, is then continuously introduced through the gas inlet 24 while being discharged through the gas outlet 25, thereby producing a hydrogen atmosphere inside the epitaxial film formation chamber 20. Subsequently, while the temperature inside the epitaxial film formation chamber 20 is raised and a material gas and a doping gas are introduced into the epitaxial film formation chamber 20 along with the carrier gas, the drive unit 8 causes the susceptor support member 5 and the lift pin support member 7 to rotate, thereby forming an epitaxial film on the silicon wafer W.

After the formation of the epitaxial film, the heater 4 lowers the epitaxial film formation chamber 20 from the set temperature for film formation to the set temperature for loading and then the drive unit 8 moves the lift pin support member 7 upward, thereby lifting the silicon wafer W off the susceptor 3 with the lift pins 6. Subsequently, with a gate valve opened, the loading unit moves the support member into the epitaxial film formation chamber 20 and stops the support member below the silicon wafer W. The drive unit 8 then causes the lift pin support member 7 to move downward, passing the silicon wafer W to the support member, and the loading unit moves the support member out of the epitaxial film formation chamber 20 along with the silicon wafer W. A manufacturing process for a single epitaxial silicon wafer is completed in this manner.

Subsequently, another new silicon wafer W is loaded in the epitaxial film formation chamber 20 by the loading unit and another epitaxial silicon wafer is manufactured by performing the above-described process.

In a case where a plurality of epitaxial silicon wafers are continuously manufactured as described above, the temperature of the epitaxial film formation chamber 20 repeatedly rises and falls between the set temperature for loading and the set temperature for film formation and the susceptor 3 is likely to be deviated from the support pins 53 due to contraction of the susceptor 3 especially during a temperature fall from the set temperature for film formation to the set temperature for loading or during a temperature fall from the set temperature for loading to room temperature. However, since the positioning portion 321A and the inclined portion 321B are continuously formed in the same shape in the radial direction of the susceptor 3, the support pins 53 are positioned at the specific positions in the circumferential direction of the susceptor 3 within the respective fitting grooves 32 during both expansion and contraction of the susceptor 3 by virtue of the above-described effect. As a result, the center of the susceptor 3 and the rotation axis of the susceptor support member 5 are always kept in alignment with each other. Each silicon wafer W is thus mounted on the same position on the susceptor 3 and subjected to a vapor deposition process for uniformity in epitaxial film thickness.

In addition, the slide contact head 532 is formed in a semispherical shape, so that the slide contact head 532 can be less likely to wear due to a relative movement relative to the arc surface portion 321, which allows for reducing a positional deviation of the susceptor 3 from the susceptor support member 5 over time.

Modifications

It should be noted that the invention is not limited to the above-described exemplary embodiment and may be improved and altered in design in a variety of manners without departing from the scope of the invention.

For instance, as shown in FIG. 5A, a support pin 54 including the base 531 and a cone-shaped slide contact head 542 provided at a distal end of the base 531 may be used in place of the support pin 53.

As shown in FIG. 5B, a fitting groove 34 having a pair of inclined portions 341B extending obliquely upward from a lower surface of the susceptor 3 and in directions to approach each other in a vertical cross sectional view and that are continuously formed in the same shape in the radial direction of the susceptor 3 may be used in place of the fitting groove 32.

As shown in FIG. 5C, a support pin 55, or fitting projection, consisting of the base 531 may be used in place of the support pin 53 in addition to using the fitting groove 34 in place of the fitting groove 32.

In configurations shown in FIG. 5A to FIG. 5C, in a state where a downward movement of the susceptor 3 relative to the support pins 54, 53, and 55 is restricted, contact portions of the support pins 54, 53, and 55 with the fitting grooves 32, 34, and 34 serve as positioning portions 321A, 341A, and 341A, respectively.

The base 531 of each of the support pins 53, 54, and 55 may be in a shape of a polygonal prism and the slide contact head 542 may be in a shape of a polygonal pyramid.

The susceptor 3 may be provided with a fitting projection having the same as or similar shape to those of the slide contact head 532 and the slide contact head 542 while the susceptor support member 5 may be provided with the fitting groove 32, 34, or 34.

The number of each of the fitting grooves 32, 34, and 34 and the support pins 53, 54, and 55 may be four or more.

EXAMPLE(S)

Next, the invention will be described in further detail with reference to Examples; however, the invention is by no means limited by these examples.

EXAMPLE(S)

A vapor deposition apparatus for 300-mm-diameter silicon wafers W that has a configuration similar to that of the above-described exemplary embodiment was prepared.

The fitting grooves 32 of the susceptor 3 were formed such that an opening width thereof was 5.5 mm in a vertical cross sectional view perpendicular to the radial direction of the susceptor 3. Further, the fitting grooves 32 were formed such that a length thereof was 10 mm in the radial direction of the susceptor 3.

The support pins 53 were each formed such that the base 531 and the slide contact head 532 were 5 mm in diameter.

Such a configuration causes the support pins 53 to be positioned with respect to the respective fitting grooves 32 with a clearance $C_A$ of 0.25 mm each between opening edges of the fitting grooves 32 and the bases 531 of the respective support pins 53 as shown in FIG. 3B.

Then, 25 epitaxial silicon wafers were continuously manufactured.

Specifically, the temperature of the epitaxial film formation chamber 20 was first heated from room temperature to the set temperature for loading, i.e., 700 degrees C., with the slide contact heads 532 of the support pins 53 positioned at the specific positions in the circumferential direction of the susceptor 3 within the respective fitting grooves 32. Next, after a silicon wafer W was loaded in the epitaxial film formation chamber 20, the vapor deposition process was performed with the temperature raised to the set temperature for film formation, i.e., 1100 degrees C., and then the temperature was lowered to the set temperature for loading. Subsequently, after an epitaxial silicon wafer was unloaded from the epitaxial film formation chamber 20, another silicon wafer W was loaded in the epitaxial film formation chamber 20 and the vapor deposition process was performed. After the same process was repeated and a 25th epitaxial silicon wafer was unloaded from the epitaxial film formation chamber 20, the temperature of the epitaxial film formation chamber 20 was lowered to room temperature.

Subsequently, 100 epitaxial silicon wafers in total were manufactured with the temperature of the epitaxial film formation chamber 20 being temporarily lowered to room temperature every after 25 epitaxial silicon wafers being continuously manufactured without changing the position of the susceptor 3.

Comparative(s)

100 epitaxial silicon wafers were manufactured under the same conditions as in Example except that fitting grooves 39 and support pins 59 as shown in FIG. 6 were used in place of the fitting grooves 32 and the support pins 53, respectively.

The fitting grooves 39 are formed in a rectangular shape that is the same in shape and size as that of the fitting grooves 32 in a bottom view. The fitting grooves 39 each include, in a vertical cross sectional view perpendicular to the radial direction of the susceptor 3, a pair of lateral surface portions 391 extending in a direction perpendicular to the lower surface of the susceptor 3 and a bottom surface portion 392 connecting upper ends of the pair of lateral surface portions 391 to each other and that is parallel with the lower surface of the susceptor 3.

The support pins 59 each include a columnar base 591, a top surface 591A of which is formed as a flattened surface perpendicular to an axis of the base 591.

The fitting grooves 39 and the support pins 59 were formed such that an opening width of the fitting grooves 39 and a diameter of the bases 591 of the support pins 59 were similar to those of the fitting grooves 32 and the support pins 53 in a vertical cross sectional view perpendicular to the radial direction of the susceptor 3, respectively.

Such a configuration causes the support pins 59 to be positioned at middle of the respective fitting grooves 39 with a clearance $C_B$ of 0.25 mm, which is the same as the clearance $C_A$, each between opening edges of the fitting grooves 39 and the respective bases 591 in a vertical cross sectional view shown in FIG. 6.

Evaluation

In each of Example and Comparative Example, an offset of a mount position of the silicon wafer W relative to a target mount position on the susceptor 3 was measured from above the susceptor 3 with a measurement device (Edge Zoom manufactured by Epicrew Corporation). Here, considering that a stop position of the silicon wafer W being loaded above the susceptor 3 is the same among all the processes, deviation between the mount position of the silicon wafer W and the target mount position means deviation of the susceptor 3 from the susceptor support member 5.

FIG. 7A shows distribution of the mount positions of the first 25 silicon wafers W during the process in Comparative and FIG. 7B shows the corresponding distribution in Example.

Further, FIG. 8A shows transition of an average deviation position (deviation amount, deviation direction) on the basis of every 25 silicon wafers being processed in Comparative Example and FIG. 8B shows the corresponding transition in Example.

It should be noted that in FIG. 7A, FIG. 7B, FIG. 8A, and FIG. 8B, values of an ordinate axis Y and abscissa axis X are values based on XYZ axes in FIG. 1, FIG. 3A, FIG. 3B, FIG. 4A, FIG. 3B, and FIG. 3C. That is, a positive value of the ordinate axis Y means a shift of the silicon wafer W toward an unloading direction and a negative value thereof means a shift of the silicon wafer W toward the loading direction D (see FIG. 3A). Similarly, a positive value of the abscissa axis X means a shift in one of directions perpendicular to the loading direction and a negative value thereof means a shift in the other direction perpendicular to the loading direction.

Further, in a case where respective positions on the abscissa axis and the ordinate axis are both zero mm, it means that the mount position is not shifted from the target mount position.

A variation in mount position in Comparative shown in FIG. 7A was smaller than a variation in Example shown in FIG. 7B. As compared also in terms of standard deviation of variation, Comparative was 0.084 mm, whereas Example was 0.063 mm.

Further, in Comparative, deviation of the mount position from the target mount position increased with an increase in the number of processed wafers and a deviation amount at completion of the process of 100 wafers was 0.75 mm as shown in FIG. 8A. In contrast, a deviation of the mount position from the target mount position was smaller in Example than in Comparative Example and a deviation amount at completion of the process of 100 wafers was 0.25 mm as shown in FIG. 8B.

The following has been found from the above-described results.

In both Comparative and Example, expansion and contraction of the susceptor 3 during rise and fall in the temperature of the epitaxial film formation chamber 20 makes the susceptor 3 likely to be deviated from the support pins 53 or 59.

In Comparative, the bottom surface portion 392 of each of the fitting grooves 39 and the top surface 591A of each of the support pins 59 are parallel with the lower surface of the susceptor 3, that is, a horizontal plane, so that if the susceptor 3 is deviated from the support pins 59, the subsequent process will be performed with the deviated state kept. This has been found to cause a gradual increase in the deviation between the mount position of the silicon wafer W and the target mount position.

Comparatively, in Example, even if the susceptor 3 is temporarily deviated from the support pins 53, the self-weight of the susceptor 3 causes the contact portions between the slide contact heads 532 and the respective fitting grooves 32 to gradually respectively move with the tops of the slide contact heads 532 coming into contact with the respective positioning portions 321A, thereby positioning the support pins 53 at the specific positions in the circumferential direction of the susceptor 3, that is, positions before the positional deviation. This has been found to make the deviation of the mount position of the silicon wafer W from the target mount position small as compared with in Comparative despite the vapor deposition process being repeated.

EXPLANATION OF CODE(S)

1 . . . vapor deposition process, 3 . . . susceptor, 5 . . . susceptor support member, 32, 34 . . . fitting groove, 321A, 341A . . . positioning portion, 321B, 341B . . . inclined portion, 53, 54 . . . support pin (fitting projection), W . . . silicon wafer

The invention claimed is:

1. A vapor deposition apparatus configured to form an epitaxial film on a silicon wafer, the vapor deposition apparatus comprising:
   a disc-shaped susceptor on which the silicon wafer is to be mounted; and
   a susceptor support member configured to support the susceptor and cause the susceptor to rotate, wherein one of the susceptor and the susceptor support member is provided with a plurality of fitting grooves and the other of the susceptor and the susceptor support member is provided with a plurality of fitting projections configured to be fitted in the respective plurality of fitting grooves, the plurality of fitting grooves each have an inclined portion and a positioning portion, the inclined portion being inclined with respect to a mount surface of the susceptor for the silicon wafer and being configured to relatively move a corresponding one of the fitting projections with respect to a said fitting groove of the plurality of fitting grooves in a circumferential direction of the susceptor with the corresponding one of the fitting projections kept in contact by virtue of a self-weight of the susceptor, the positioning portion being configured to position the corresponding one of the fitting projections relatively moved by the inclined portion at a specific position in the circumferential direction, and the inclined portion and the positioning portion are formed continuously in a radial direction of the susceptor.

2. The vapor deposition apparatus according to claim 1, wherein
a contact portion of each of the fitting projections, that contacts the inclined portion, is formed in a shape of a convex curve.

3. The vapor deposition apparatus according to claim 2, wherein
the susceptor is provided with the plurality of fitting grooves,
the susceptor support member is provided with the plurality of fitting projections,
the inclined portion comprises a pair of inclined portions, and the plurality of fitting grooves each have the pair of inclined portions, and
the pair of inclined portions extends obliquely upward from a lower surface of the susceptor and in directions to approach each other in a vertical cross sectional view.

4. The vapor deposition apparatus according to claim 1, wherein
a surface roughness Ra of each of the inclined portion and the positioning portion is 2 µm or less.

5. A method of manufacturing an epitaxial silicon wafer, the method comprising forming the epitaxial film on the silicon wafer, wherein
the epitaxial film on the silicon wafer is formed by using the vapor deposition apparatus according to claim 1.

6. The vapor deposition apparatus according to claim 1, wherein the inclined portion and the positioning portion are formed to extend continuously in the radial direction of the susceptor over a length of the said fitting groove of the plurality of fitting grooves in the radial direction of the susceptor.

7. The vapor deposition apparatus according to claim 6, wherein the said fitting groove of the plurality of fitting grooves is formed in a rectangular shape extending in the radial direction of the susceptor.

* * * * *